United States Patent
Daultier et al.

(10) Patent No.: US 8,310,266 B2
(45) Date of Patent: Nov. 13, 2012

(54) DEVICE FOR CHARACTERIZING THE ELECTRO-OPTICAL PERFORMANCE OF A SEMICONDUCTOR COMPONENT

(75) Inventors: Yves Daultier, Echirolles (FR); Frédéric Dupont, Crolles (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 272 days.

(21) Appl. No.: 12/729,569

(22) Filed: Mar. 23, 2010

(65) Prior Publication Data
US 2010/0259291 A1    Oct. 14, 2010

(30) Foreign Application Priority Data
Apr. 8, 2009  (FR) ...................... 09 52278

(51) Int. Cl.
*G01R 31/26* (2006.01)
*G01R 31/20* (2006.01)
(52) U.S. Cl. ................ 324/762.01; 324/757.01
(58) Field of Classification Search .. 324/755.01–755.1, 324/754.01–754.3, 750.01–750.3, 762.01–762.1; 269/90–100, 287; 438/14–18; 257/48
See application file for complete search history.

(56) References Cited

U.S. PATENT DOCUMENTS

| | | | |
|---|---|---|---|
| 4,115,736 A | 9/1978 | Tracy | |
| 4,870,352 A | 9/1989 | Koechner | |
| 4,875,004 A | 10/1989 | Boyd | |
| 5,166,606 A | 11/1992 | Blanz | |
| 5,471,055 A | 11/1995 | Costanzo et al. | |
| 6,433,294 B1 * | 8/2002 | Nemoto et al. | 209/573 |
| 7,160,808 B2 * | 1/2007 | Kassir | 438/690 |
| 7,348,768 B2 * | 3/2008 | Lee | 324/757.04 |
| 2009/0179658 A1 | 7/2009 | Werner et al. | |

FOREIGN PATENT DOCUMENTS

| | | |
|---|---|---|
| EP | 0 154 947 A2 | 9/1985 |
| EP | 0 194 668 A2 | 9/1986 |
| EP | 0 672 873 A1 | 9/1995 |
| WO | 02/084313 A1 | 10/2002 |

OTHER PUBLICATIONS

H.J.M. ter Brake et al., "*SCENET Roadmap for Superconductor Digital Electronics*," Physica C, North-Holland Publishing, Amsterdam, NL, vol. 439, No. 1, Jun. 1, 2006, pp. 1-41.

* cited by examiner

*Primary Examiner* — Tung X Nguyen
(74) *Attorney, Agent, or Firm* — Burr & Brown

(57) ABSTRACT

A device for characterizing the electro-optical performance of a semiconductor component includes a chamber containing a controlled atmosphere; a measuring head equipped with conductive probes for contacting the electrical interfaces of said component and connected to a data processing system in order to determine said electro-optical performance; and a staging fixture support to accommodate said component(s), the staging fixture being capable of being cooled and being moved in an upward and downward translational movement to bring the electrical interfaces of said component(s) into contact with the tip of the measuring probes of the measuring head. The staging fixture has bumps and the components are positioned in contact with these and the staging fixture accommodates, in the area of each of these bumps, two positioning grids which are capable of sliding relative to each other and cooperating with each other to define pockets suitable for accommodating the component(s) to be characterized.

5 Claims, 4 Drawing Sheets

DEVICE FOR CHARACTERIZING THE ELECTRO-OPTICAL PERFORMANCE OF A SEMICONDUCTOR COMPONENT

FIELD OF THE INVENTION

The present invention relates to the technical field of the semiconductor industry and, in particular, is designed to make it possible to characterize the performance, especially the electro-optical performance, of a semiconductor component or a batch of unitary semiconductor components, especially by simulating its/their subsequent nominal conditions of use.

BACKGROUND OF THE INVENTION

In the field of electronics in general and that of semiconductor components for detecting infrared radiation in particular, it is necessary to systematically check the performance of components before they are fitted in a more complex structure, especially in a detector. These components are used in infrared detectors which classically comprise unitary hybrid components consisting of detection circuits mounted on a silicon readout circuit and their nominal operating temperature is classically 70 to 200 K.

Because they are "quantic" detectors, the operating temperature dictated by the physical principle which they exploit is that of liquid nitrogen and it is therefore necessary to check the actual performance of components at this temperature of use.

The use of test equipment which is advantageously automated and currently referred to in the field in question by the term "cryoprober" is known. Such equipment, the general principle of which is described in relation to FIG. 1, classically comprises a measuring head (5) equipped with probes (6) which come into contact with the electrical interfaces of the semiconductor component and a motor-driven staging fixture (3) which is controlled by a viewing system and accommodates the component under test, this entire assembly being isolated in a chamber (1) which is generally a high-vacuum chamber which is cooled to a very low temperature by a flow of cryogenic fluid (4) which is typically liquid nitrogen.

Chamber (1) also comprises a viewing port (2) on its upper surface which is capable of allowing illumination of the component under test or enables the latter to detect a scene outside the chamber.

The component which is to be characterized is put in place and held in contact with staging fixture (3) by means of foil made of oxidizable steel, said staging fixture being motor driven so as to allow the electrical interfaces of the component to come into contact with the tip of the probes of the measuring head. The measuring head ensures activation and readout of information for each of the components by establishing contact with them sequentially.

As a result of this structure, the components to be characterized are therefore cooled only by thermal conduction as they come into contact with the cooled staging fixture and by means of a mechanical retention system.

Because of the expected performance in their eventual applications, the components only have very small inactive surface areas available to ensure such mechanical retention because the bulk of their central zone is optically active and their peripheral surround is mainly reserved for electrical wiring and interfacing. FIGS. 2 and 3 schematically show a top view and a perspective view of such a component respectively. Component (10) therefore comprises an optically active central zone (12) and an optically inactive peripheral zone (11). The electrical interfaces of the components are also shown and denoted by (13).

This being so, only components which have sufficiently large inactive zones which are much bigger than the clearance allowed when slicing silicon wafers can be tested in a high-vacuum cryoprober.

Ultimately, the objective is to achieve the following result:
make it possible to load batches of hybrid components into such a cryoprober;
ensure extensive compatibility with several component geometries;
preserve the physical and functional integrity of components and, especially, not affect the active zone or inactive zone as a result of mechanical retention;
be able to ensure nominal cooling of components without having to resort to adhesives or greases;
enable electro-optical characterization at temperatures controlled to within ±0.5 K.

The electro-optical performance data resulting from characterization operations are essentially:
sensitivity to illumination;
signal-to-noise ratio;
defects, i.e. the number of pixels in the active zone of the component which cannot be used.

Essentially, two types of such "cryoprobers" used to ensure characterization at very low temperature are currently known.

Firstly so-called "overpressured" cryoprobers: In such a system, the test chamber is pressurized by a scavenging gas which does not condense at the characterization temperature, said gas generally consisting of dry nitrogen.

The components to be characterized are held on the staging fixture by subjecting their rear surface to negative pressure. Thermal transfer is ensured by the residual gas layer between the component and the staging fixture as well as by convection of cold gas between the staging fixture and the cooled measuring head.

Although such "overpressure" cryoprobers offer good component cooling efficiency and also ensure that components are secured without any mechanical contact with their front surface, thus preserving their physical integrity, their use does have one drawback: high consumption of cryogenic liquid. Not only that, cooling by convection imposes limitations in the case of certain electro-optical characterization processes, especially noise measurements which are polluted by variations in parameters which are sensitive to thermal fluctuations.

So-called "high-vacuum" cryoprobers are also known. In this setup, the test chamber is subjected to a high vacuum. The components are secured on the cooled staging fixture with the aid of a grid fitted with stainless steel foil. Thermal contact between the components and the cooled staging fixture is ensured by mechanical pressure applied to the front surface by the foil, this force being exerted on the inactive zones of the circuits.

These high-vacuum cryoprobers have the advantage of being able to provide nominal characterization conditions which are equivalent to the envisaged ultimate application thanks to the absence of internal convection and they also consume little cryogenic liquid.

On the other hand, one comes up against design constraints which are necessary in order to guarantee mechanical retention and thermal contact between the component and the staging fixture; these constraints are generally incompatible with the miniaturization of components which is a constant objective for those skilled in the art.

The object of the invention is precisely to optimize retention of hybrid components on the cooled staging fixture without affecting the physical integrity of said component and without impacting the efficiency of actual cooling itself.

SUMMARY OF THE INVENTION

To achieve this, the invention relates to a device for ensuring characterization of the electro-optical performance of a semiconductor component or a batch of such components in a vacuum or controlled atmosphere, comprising:

- a chamber containing a vacuum or controlled atmosphere;
- a measuring head equipped with conductive probes which are designed to come into contact with the electrical interfaces of said component and are connected to a data processing system in order to determine said electro-optical performance;
- a staging fixture support intended to accommodate the component(s), the staging fixture being capable of being cooled and being moved in an upward and downward translational movement making it possible to bring the electrical interfaces of said component(s) into contact with the tip of the measuring probes of said measuring head;

According to the invention:

- the staging fixture has bumps and the components are positioned so that they are in contact with these;
- in the area of each of these bumps, the staging fixture accommodates two positioning grids which are capable of sliding relative to each other and cooperating with each other to define pockets suitable for accommodating the component(s) to be characterized;
- the measuring head is also equipped with mechanical probes which press against the inactive zone of said components in order to hold them in place on the staging fixture.

In other words, the components whose electro-optical performance one wishes to measure are secured directly by the measuring head rather than by a tool associated with the staging fixture support. Because of the delicateness of the mechanical probes associated with the measuring head, there is no longer any risk of affecting the physical integrity of the components.

According to one characteristic aspect of the invention, each of the bumps on the staging fixture accommodates an indium interface which is ideal for encouraging thermal transfer between the staging fixture and the component.

Advantageously, the indium interface has a typical thickness of 20 to 200 micrometers and is assembled on the bumps made on the body of the staging fixture by bonding.

According to another advantageous aspect of the invention, the sliding positioning grids are equipped, on the edges of their opposite-facing lateral walls, with micro teeth which prevent accidental displacement of said component after it is fitted.

According to another aspect of the invention, extra probes can be added to the measuring head in order to optimize mechanical retention of the component on the staging fixture and/or non-standard probes of the bump-contact type having the larger dimensions can be added.

BRIEF DESCRIPTION OF THE DRAWINGS

The way in which the invention may be implemented and its resulting advantages will be made more readily understandable by the description of the following embodiment, given merely by way of example, reference being made to the accompanying drawings.

DETAILED DESCRIPTION OF THE INVENTION

Figure 1:
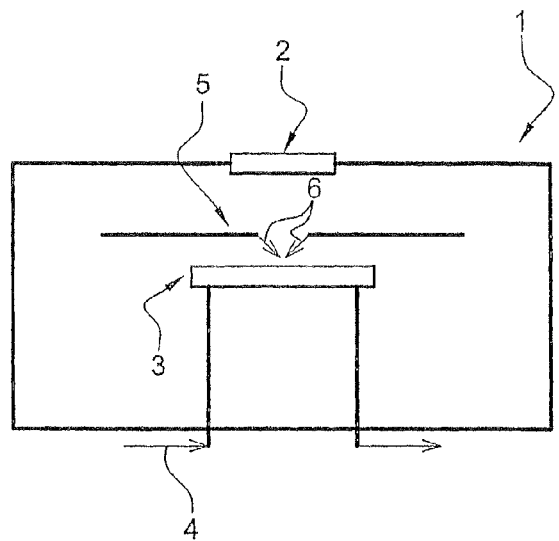
FIG. 1 shows, as stated above, a schematic embodiment of the operating principle of a "cryoprober".
Figure 2:
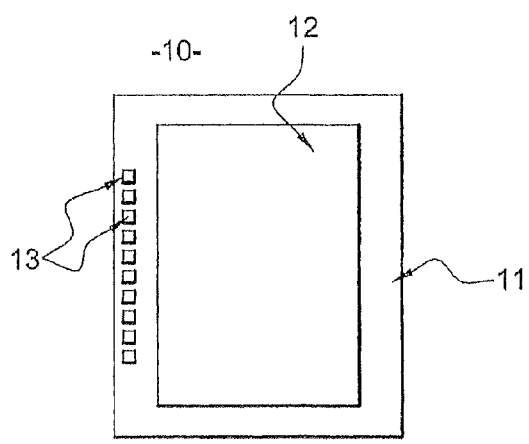
FIGS. 2 and 3, which are also described above, are schematic top and perspective views respectively of a component in a classic style.
Figure 3:
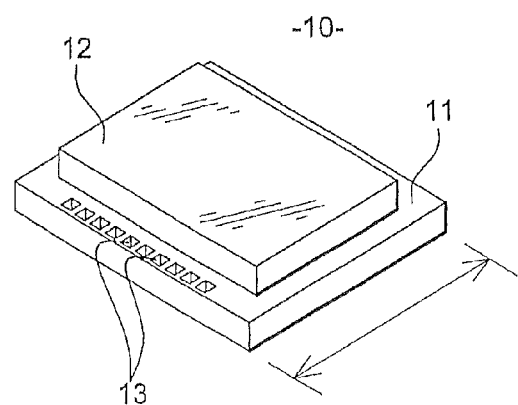
Figure 4:
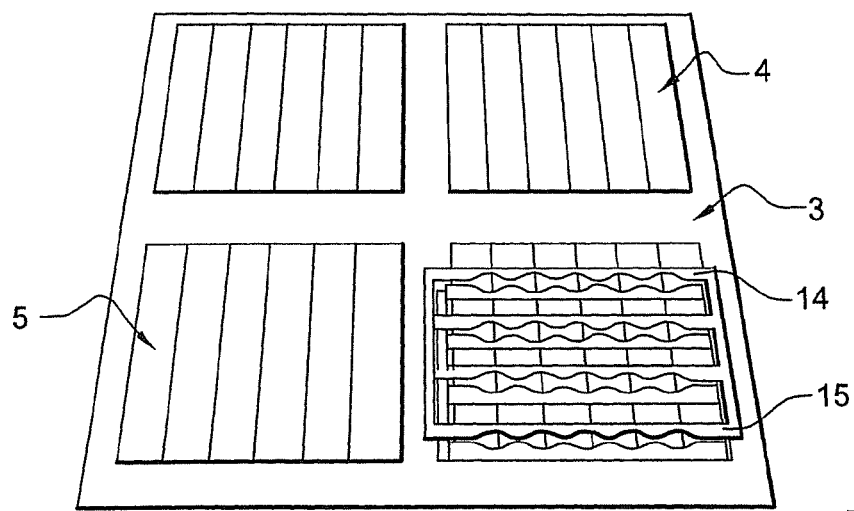
FIG. 4 is a schematic top view of the cooled staging fixture used in the device according to the invention.

FIG. 4 shows the upper surface of staging fixture (3) in accordance with the invention.

This staging fixture (3) is typically made of copper or aluminum. It is actually divided into four identical zones designed to facilitate the loading of small series of components which are to be characterized. Each zone is in fact defined by a bump of several millimeters which is machined from a single piece and has a typical flatness of the order of 5 µm/cm.

An indium interface (4) having a thickness of 20 to 200 micrometers is mounted on these bumps, especially by bonding.

A cryogenic liquid flows underneath said staging fixture, this liquid is actually liquid nitrogen (not shown).

The indium interface has columnar grooves (5) into which component grippers can be inserted, thus facilitating handling or positioning the components on the staging fixture without any risk of damaging them.

In addition, each of zones (4) of the staging fixture, accommodates two positioning grids (14) and (15) which slide relative to each other. These two grids are designed to cooperate with each other in order to define pockets (16) in which components (10) are positioned.

These grids are typically made of aluminum or stainless steel and, on their lateral edge, have opposite-facing micro teeth (17) which improve retention of the components here.

Figure 5:
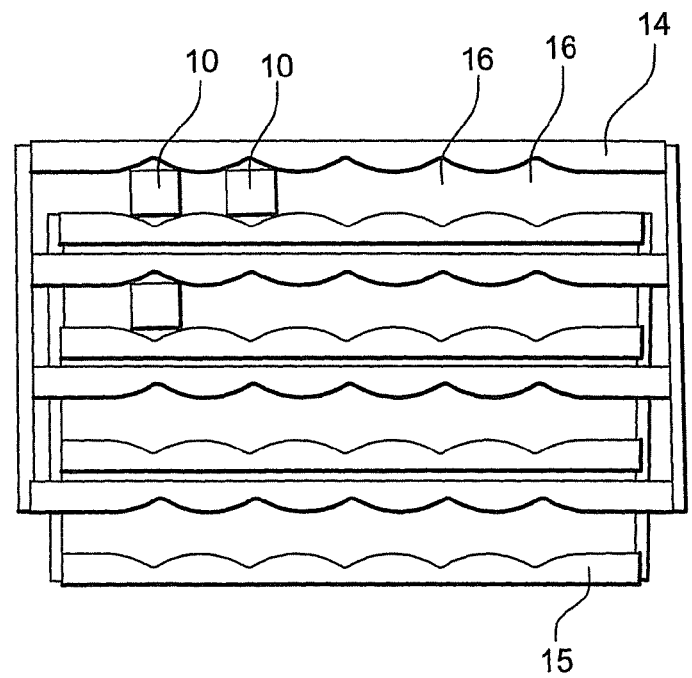
FIG. 5 shows the way in which the positioning grids used on the staging fixture cooperate with each other.
Figure 6:
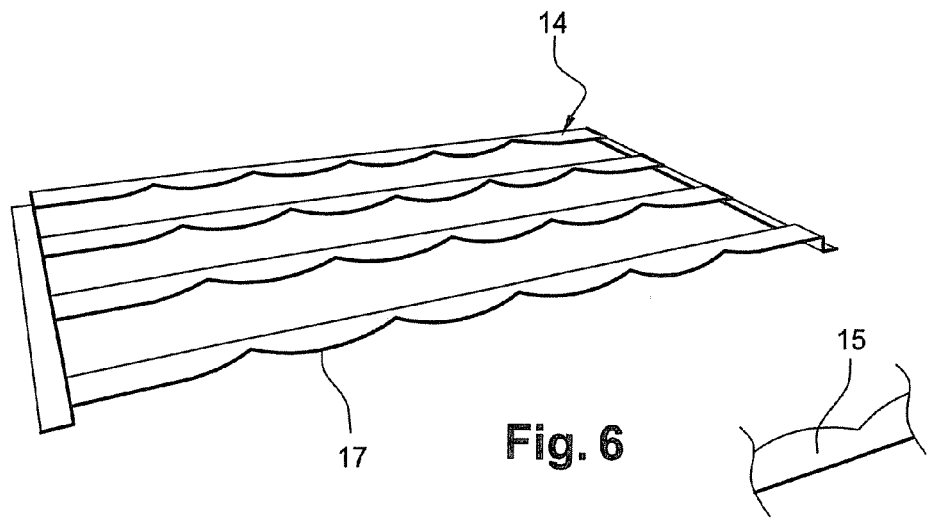
FIG. 6 is a detailed view of one of the two positioning grids in accordance with the invention.

As shown in FIG. 5, it is possible to position a plurality of components in a single zone (4) of the staging fixture.

Figure 7:
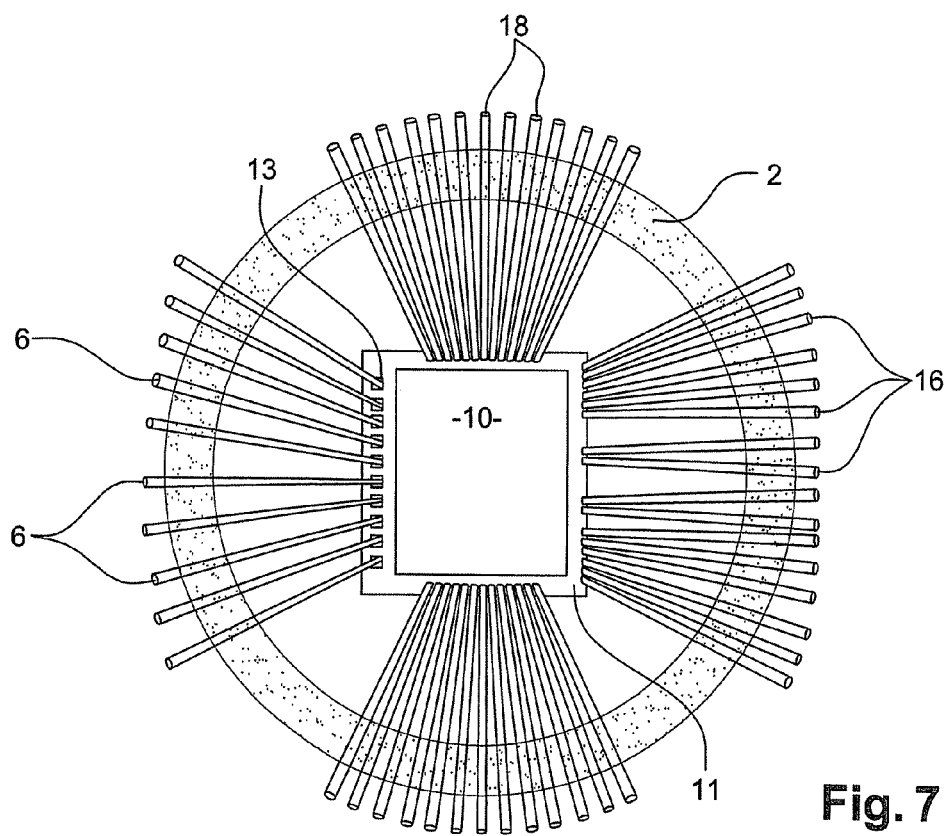
FIG. 7 is a schematic top view of the measuring head in accordance with the invention and FIG. 8 is a perspective view thereof.

FIG. 7 shows a top view of the way in which components (10) are retained on said staging fixture in accordance with the invention; positioning grids (14, 15) are not represented in order to avoid superfluous details which would make the Figure unnecessarily complicated.

In fact, the measuring head comprises four sets of probes; one set of actual measuring probes (6), the free ends of which come into contact with the electrical interfaces (13) of components (10) and three sets of probes which fulfill only a retention function (18) and which press against the inactive peripheral zone (11) of said component respectively.

These probes are classically made of a tungsten-rhenium based alloy, have a free length of approximately 5 mm and a conical profile having a typical diameter of 200 micrometers at their root, i.e. in the area where they are attached to the actual measuring head, and a diameter of 40 micrometers in the area where they are in contact with component (10). The mechanical stress exerted by each of the probes is approximately 1 g over a 20 micrometer contact area.

Advantageously, the measuring probes and retention probes are identical.

It is apparent that when staging fixture (3) moves upwards, the probes (both electrical measuring probes (6) and mechanical retention probes (18)) press against the previously described areas of the component with the mechanical probes ensuring that the component is secured on said staging fixture.

This being so, because of the smaller diameter of the free ends of the probes or contact tips, there is no risk of damaging the physical integrity of the component because these probes only interact with the inactive zones of the component or come into limited contact with its electrical interfaces.

Figure 8:
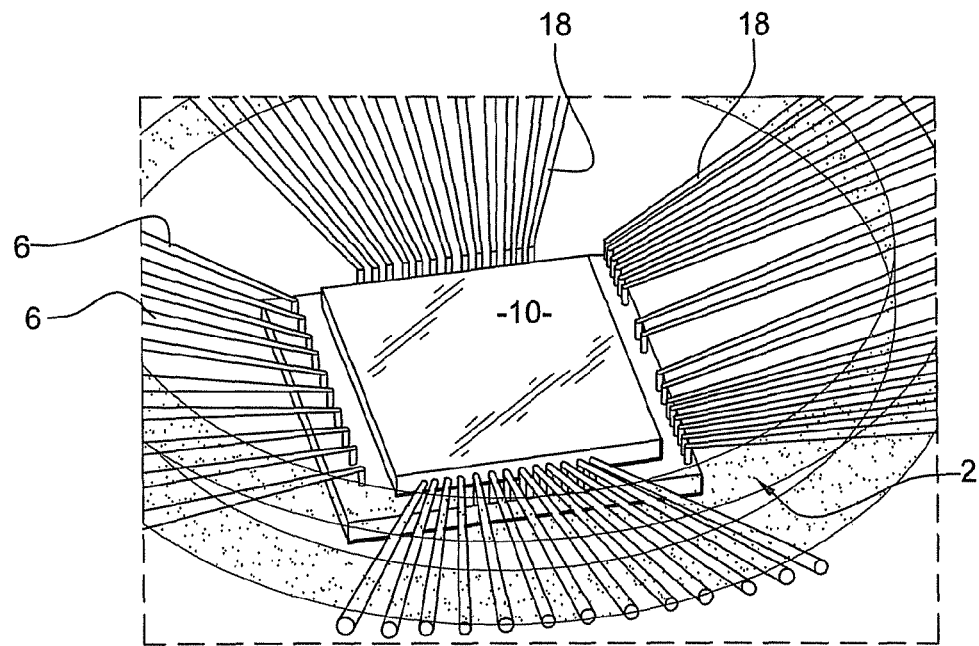

This is shown very clearly in FIG. 8.

Also, because there are optical self-alignment systems in testers or "cryoprobers", the component under test is always accurately centered relative to the measuring head, once again avoiding any risk of damaging the component.

Figure 9:
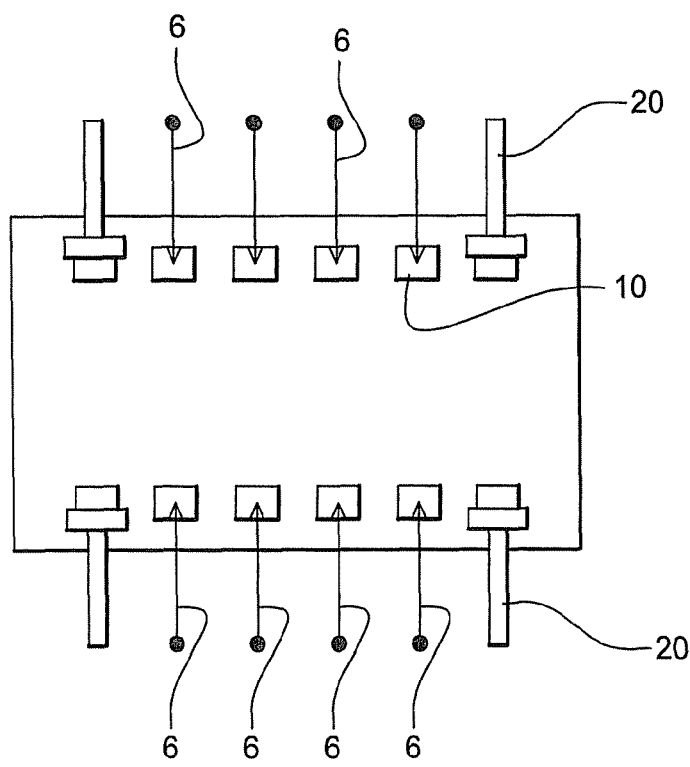
FIG. 9 is an alternative embodiment of the invention intended to show the way in which the retention bump contacts are used.

FIG. 9 shows a variant of the invention in which the component is secured on the staging fixture by non-standard test probes which actually consist of bump contacts (20) These cooperate with a specific dedicated area provided in the inactive zone of the component.

All the advantages of the present invention are readily apparent; it is a device which is simple to implement and use and it improves retention of the component whose electro-optical performance is to be measured on the cooled staging fixture without compromising the component's physical integrity. In addition, because mechanical retention is optimized, thermal contact between the component and said staging fixture is also improved.

The invention claimed is:

1. A device for characterizing an electro-optical performance of a semiconductor component in a vacuum or controlled atmosphere, comprising:
   a chamber containing a vacuum or controlled atmosphere;
   a measuring head equipped with conductive probes designed to come into contact with the electrical interfaces of the component and connected to a data processing system in order to determine the electro-optical performance;
   a staging fixture support intended to accommodate the component, the staging fixture being capable of being cooled and being moved in an upward and downward translational movement making it possible to bring the electrical interfaces of the component into contact with the tip of the measuring probes of the measuring head;
   wherein the staging fixture has bumps and the component is positioned so that the component is in contact with the bumps;
   wherein, in the area of each of these bumps, the staging fixture accommodates two positioning grids which are capable of sliding relative to each other and cooperating with each other to define pockets suitable for accommodating the component to be characterized;
   and wherein the measuring head is also equipped with mechanical probes which press against the inactive zone of the component in order to hold the component in place on the staging fixture.

2. The device for characterizing the electro-optical performance of a semiconductor component as claimed in claim 1, wherein the bumps on the staging fixture accommodate an interface made of indium.

3. The device for characterizing the electro-optical performance of a semiconductor component as claimed in claim 2, wherein the indium interface has a thickness of 20 to 200 micrometers and is mounted on the bumps made on the staging fixture by bonding.

4. The device for characterizing the electro-optical performance of a semiconductor component as claimed in claim 1, wherein the sliding positioning grids have, at the level of the edges of their opposite-facing lateral walls, micro teeth which prevent accidental displacement of the component after the component is fitted.

5. The device for characterizing the electro-optical performance of a semiconductor component as claimed in claim 1, wherein the measuring head also comprises at least one of extra probes in order to optimize mechanical retention of the component on the staging fixture and non-standard probes of the bump-contact type having larger dimensions and capable of cooperating with specific dedicated areas provided in the inactive zone of the component.

\* \* \* \* \*